(12) United States Patent
Chollangi et al.

(10) Patent No.: US 11,567,741 B2
(45) Date of Patent: Jan. 31, 2023

(54) MEMORY COMPILER TECHNIQUES

(71) Applicant: Arm Limited, Cambridge (GB)

(72) Inventors: Mouli Rajaram Chollangi, Fremont, CA (US); Sriram Thyagarajan, Austin, TX (US); Hongwei Zhu, San Jose, CA (US); Yew Keong Chong, Austin, TX (US); Pratik Ghanshambhai Satasia, Cedar Park, TX (US)

(73) Assignee: Arm Limited, Cambridge (GB)

( * ) Notice: Subject to any disclaimer, the term of this patent is extended or adjusted under 35 U.S.C. 154(b) by 230 days.

(21) Appl. No.: 16/899,502

(22) Filed: Jun. 11, 2020

(65) Prior Publication Data

US 2021/0389934 A1 Dec. 16, 2021

(51) Int. Cl.
| | | |
|---|---|---|
| G06F 8/30 | (2018.01) | |
| G06F 8/38 | (2018.01) | |
| G06F 8/71 | (2018.01) | |
| G06F 16/901 | (2019.01) | |
| G11C 7/00 | (2006.01) | |
| G06F 12/00 | (2006.01) | |
| G06F 8/41 | (2018.01) | |

(52) U.S. Cl.
CPC ............... G06F 8/37 (2013.01); G06F 8/38 (2013.01); G06F 8/71 (2013.01); G06F 16/901 (2019.01); G11C 7/00 (2013.01); G06F 12/00 (2013.01)

(58) Field of Classification Search
CPC . G06F 8/37; G06F 16/901; G06F 8/38; G06F 8/71; G06F 12/00; G11C 7/00
USPC .......................................................... 711/170
See application file for complete search history.

(56) References Cited

U.S. PATENT DOCUMENTS

2018/0173822 A1* 6/2018 Zhu ..................... G06F 30/39
2020/0019669 A1* 1/2020 Schuppe ............... G06F 30/367

* cited by examiner

*Primary Examiner* — Edward J Dudek, Jr.
*Assistant Examiner* — Sidney Li
(74) *Attorney, Agent, or Firm* — Pramudji Law Group PLLC; Ari Pramudji

(57) ABSTRACT

Various implementations described herein are directed to a system and methods for memory compiling. For instance, a method may include selecting source corners from a memory compiler configuration and generating a standardized set of memory instances for the selected source corners. Also, the method may include deriving a reduced set of memory instances based on the standardized set of memory instances and building a memory compiler database for a compiler space based on the standardized set of memory instances and the reduced set of memory instances.

18 Claims, 7 Drawing Sheets

300A

1-D Variation or Delta Between Option 302A data-hold time values for standard-option 310

|  |  | columns | | |
|---|---|---|---|---|
|  |  | 4 | 64 | 128 |
| rows | 8 | 50 | 70 | 90 |
|  | 128 | 50 | 70 | 90 |
|  | 256 | 50 | 70 | 90 | data-hold time values for redundancy-option 312

|  |  | columns | | |
|---|---|---|---|---|
|  |  | 4 | 64 | 128 |
| rows | 8 | 80 | 100 | 120 |
|  | 128 | 80 | 100 | 120 |
|  | 256 | 80 | 100 | 120 | capture the difference/delta between the two-options for min-rows with the three-column-variants 314

|  |  | columns | | |
|---|---|---|---|---|
|  |  | 4 | 64 | 128 |
| rows | 8 | 30 | 30 | 30 |

2-D Variation or Scaling Between Option 302B access-time time values for standard-option 320

|  |  | columns | | |
|---|---|---|---|---|
|  |  | 4 | 64 | 128 |
| rows | 8 | 50 | 70 | 90 |
|  | 128 | 60 | 80 | 100 |
|  | 256 | 70 | 90 | 110 | access-time time values for power-gating-option 322

|  |  | columns | | |
|---|---|---|---|---|
|  |  | 4 | 64 | 128 |
| rows | 8 | 53 |  | 99 |
|  | 128 |  |  |  |
|  | 256 | 76 |  | 126 | capture the ratio between the two-options for the
four-corner instance combinations 324

|  |  | columns | | |
|---|---|---|---|---|
|  |  | 4 | 64 | 128 |
| rows | 8 | 1.06 |  | 1.10 |
|  | 128 |  |  |  |
|  | 256 | 1.09 |  | 1.15 |

Optimize Base Option Set 302C liberty arcs that vary with rows only 330

|  |  | columns | | |
|---|---|---|---|---|
|  |  | 4 | 64 | 128 |
| rows | 8 | 50 | 50 | 50 |
|  | 128 | 65 | 65 | 65 |
|  | 256 | 80 | 80 | 80 | liberty arcs that vary with columns only 332

|  |  | columns | | |
|---|---|---|---|---|
|  |  | 4 | 64 | 128 |
| rows | 8 | 50 | 70 | 90 |
|  | 128 | 50 | 70 | 90 |
|  | 256 | 50 | 70 | 90 | liberty arcs that vary with both rows and columns 334

|  |  | columns | | |
|---|---|---|---|---|
|  |  | 4 | 64 | 128 |
| rows | 8 | 50 | 70 | 90 |
|  | 128 | 60 | 80 | 100 |
|  | 256 | 70 | 90 | 110 | liberty arcs that do not vary with rows or columns 336

|  |  | columns | | |
|---|---|---|---|---|
|  |  | 4 | 64 | 128 |
| rows | 8 | 50 | 50 | 50 |
|  | 128 | 50 | 50 | 50 |
|  | 256 | 50 | 50 | 50 |

FIG. 3C

MEMORY COMPILER TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern circuit designs, some memories have a variety of configurations that typically consume a substantial portion of area in semiconductor chips. Due to changing requirements and shortening time-to-market cycles, solutions involving memory compilers are widely utilized. Some memory characterizations are used for generating liberty files, and some instance characterization tools are used to run simulations for characterizing all of the arcs needed for each given instance size. Some arcs are categorized into timing, power (dynamic/leakage) and area. If a circuit designer wants to create several memory instances with different sizes/options, then the same process can be repeated for several instances and process, variation and temperature (PVT) corners. Unfortunately, this can be extremely time-consuming and inefficient. As such, there exists a need to improve the manner in which memory instances are characterized and generated.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIGS. 3A-3C illustrate diagrams of various variations and/or scaling between options in accordance with implementations described herein.

DETAILED DESCRIPTION

Various implementations described herein are directed to memory compiler schemes and techniques for various physical design applications. The various schemes and techniques described herein may also provide for efficient and accurate methods for memory compiler database generation. In various implementations, a memory compiler may be used to build memory characterization databases for selected source corners that are used to derive databases of other corners for liberty/timing related views that positively impact accuracy of new corners and further impact yield of semiconductor chips. As such, the various schemes and techniques described herein may be used to provide an efficient technique to select particular instances to use for characterization of the different arcs for a given memory-compiler option. Also, an optimized set of instances may be selected to generate data and information for other options supported by the memory compiler for the same liberty corner. Once the source corner database is created, new destination corners may be derived from the source corners using an intelligent scaling method.

Various implementations of memory compiler schemes and techniques will be described in detail herein with reference to FIGS. 1-5.

Figure 1:
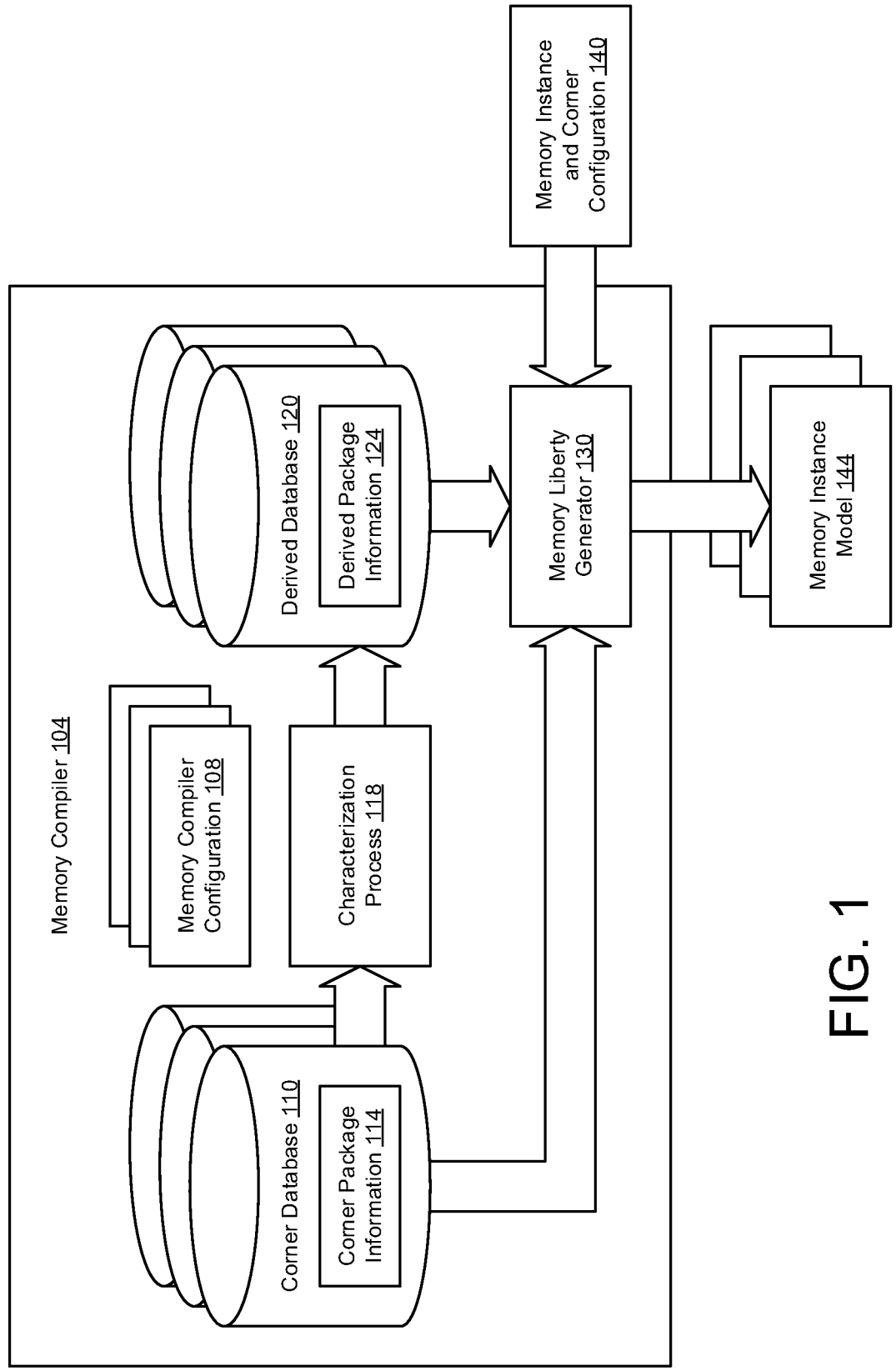
FIG. 1 illustrates a diagram of memory compiler architecture in accordance with various implementations described herein.

FIG. 1 illustrates a schematic diagram of memory compiler architecture 102 in accordance with various implementations described herein.

In various implementations, the memory compiler architecture 102 may refer to a system or a device having various integrated circuit (IC) components that are arranged and coupled together as an assemblage or combination of parts that provide for a physical circuit design and related structures. In some instances, a method of designing, providing and building the memory compiler architecture 102 as an integrated system and/or device that may be implemented with various IC circuit components is described herein so as to implement memory compiler schemes and techniques associated therewith. Also, the memory compiler architecture 102 may be integrated with memory compiler computing circuitry and related components on a single chip, and the memory compiler architecture 102 may be implemented in various embedded systems for automotive, electronic, mobile and Internet-of-things (IoT) applications, including remote sensor nodes.

As shown in FIG. 1, the memory compiler architecture 102 may be associated with a memory compiler 104 and one or more memory compiler configuration data files 108 that provide information for supporting the memory compiler 104. In some instances, the memory compiler 104 may also include multiple different databases 110, 120 and a memory liberty generator 130 that receives data and information from the databases 110, 120, memory instances and a corner configuration 140 so as to generate (or build) one or more memory instance models 114 that may be used to fabricate or manufacture memory instances. Thus, the memory compiler 104 may be used to access the memory instances stored in the memory compiler configuration and build a memory compiler database for a compiler space based on standardized packages of the memory instances and/or based on reduced packages (or optimized packages) of the memory instances.

In some instances, the memory compiler architecture 102 may include one or more corner databases 110, which may also be referred to as one or more source corner databases. The one or more corner databases 110 may have corner package information 114 that may include standardized packages of memory instances. The memory compiler 104 may select source corners from the memory compiler configuration 108 and generate the standardized packages of memory instances for the selected source corners. Also, the standardized packages may have various timing arcs, memory instances and derating configurations, and each timing arc of the timing arcs may be assigned multiple memory instances that are used for memory compiler characterization.

In some instances, the memory compiler architecture 102 may include one or more derived databases 120, which may also be referred to as one or more destination corner databases. The one or more derived databases 120 may have derived package information 124 that may include reduced packages of memory instances. The memory compiler 104 may use a characterization process 118 to derive the reduced packages of the memory instances based on the standardized packages of memory instances. Also, the memory compiler 104 may use the characterization process 118 to scale data related to the standardized packages and the reduced packages so as to provide characterized data used for manufacturing the memory instances. Also, the memory compiler 104 may use the characterization process 118 to interpolate data associated with the standardized packages and the reduced packages so as to thereby provide characterized data for the memory instances that is used for memory compiler characterization.

In some instances, the memory compiler 104 may be configured to generate the reduced packages based on simulating the standardized packages and/or based on reusing pre-existing entries of the memory instances provided in the memory compiler configuration 108. The memory compiler 104 may use the characterization process 118 to characterize the standardized package of memory instances for a compiler space with one or more different features and/or aspect ratios, and also to validate the standardized package of memory instances for a compiler space. Also, the memory compiler 104 may use the characterization process 118 to characterize the reduced packages of memory instances for a compiler space with one or more different features and/or aspect ratios, and also to validate the reduced package of memory instances for the compiler space.

In some instances, the memory compiler 104 may be configured to build the derived corner database 120 with the reduced packages of memory instances based on characterizing the standardized packages of memory instances. The reduced packages of memory instances may be selected to generate information for other compiler options, and the derived corner database 120 may have destination corners that are derived from the source corners of the memory compiler configuration 108 using an intelligent scaling technique and/or using an intelligent interpolation technique. Also, the memory compiler 104 may be configured to categorize the memory instances based on one or more factors, such as, e.g., timing, power, leakage, accuracy-settings and/or similar.

Figure 2:
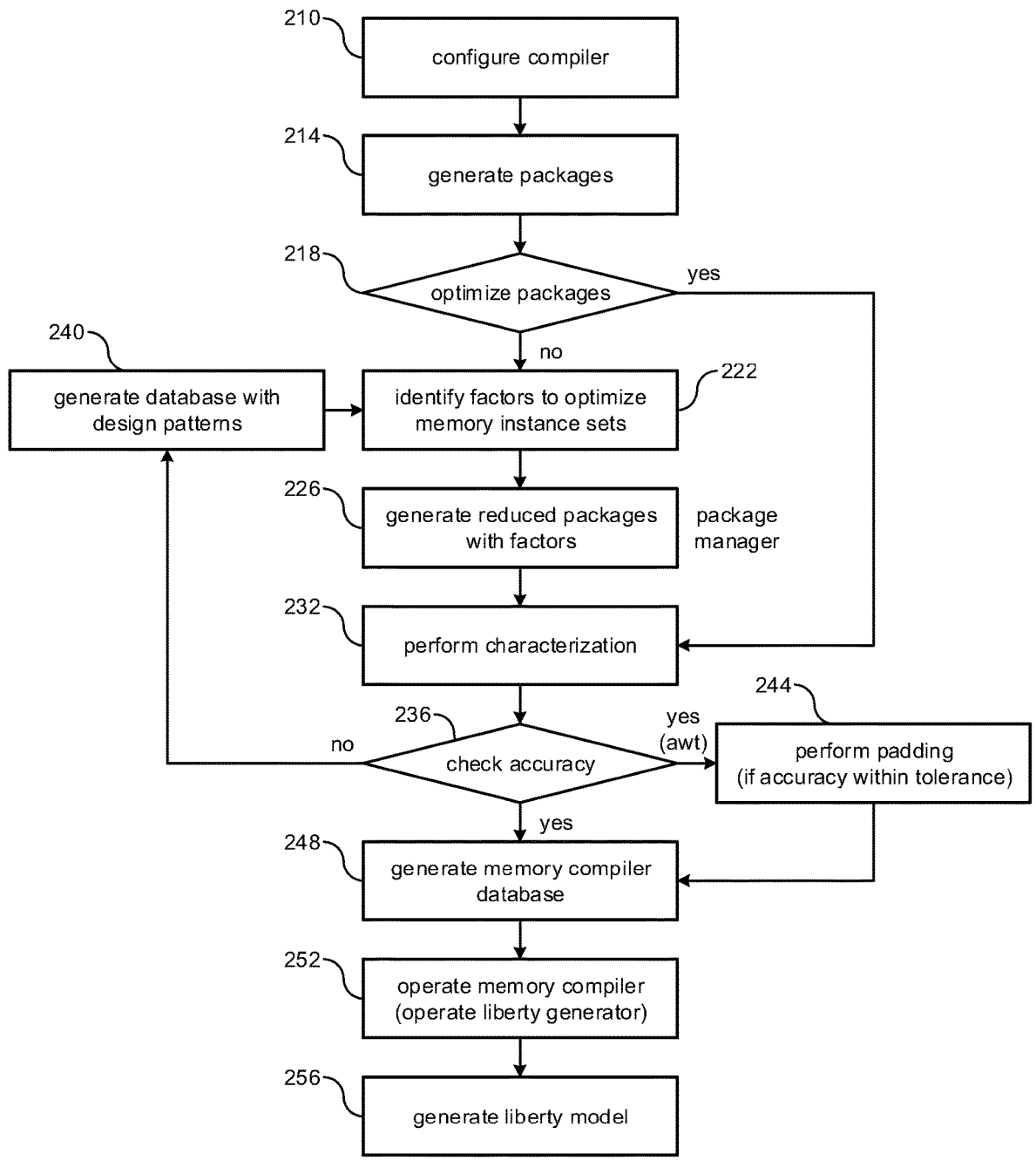
FIG. 2 illustrates a process flow diagram of a method for providing memory compiler techniques in accordance with implementations described herein.

FIG. 2 illustrates a process diagram of a method 200 for providing memory compiler techniques in accordance with implementations described herein.

It should be understood that even though method 200 may indicate a particular order of operation execution, in some cases, various portions of the operations may be executed in a different order, and on different systems. In other cases, other operations and/or steps may be added to and/or omitted from method 200. Also, method 200 may be implemented in hardware and/or software. If implemented in hardware, method 200 may be implemented with systems, components and/or circuitry, as described herein in reference to FIG. 1. Also, if implemented in software, method 200 may be implemented as a program and/or software instruction process that is configured for providing memory compiler schemes and techniques described herein. Also, if implemented in software, instructions related to implementing method 200 may be recorded in memory and/or a database. For instance, various types of computing devices having at least one processor and memory may be configured to perform method 200.

In various implementations, method 200 may refer to a method of designing, providing, building, fabricating and/or manufacturing memory compiler architecture as an integrated system, device and/or circuitry that may involve use of various circuit or system components described herein so as to implement various memory compiler schemes and techniques associated therewith. In some instances, the memory compiler architecture may be integrated with computing circuitry and various related components on a single chip, and the memory compiler architecture may be implemented in various embedded chip-level systems for various electronic, mobile and Internet-of-things (IoT) applications, including remote sensor node applications.

At block 210, method 200 may configure a compiler, such as, e.g., a memory compiler that is used for building a memory compiler database. In some instances, the memory compiler may be configured to select source corners from a memory compiler configuration.

At block 214, method 200 may generate packages. In some instances, method 200 may use the memory compiler to generate a standardized set of memory instances for the selected source corners. In some instances, data and information associated with the standardized memory instances may be packaged in a corner package file.

At decision block 218, method 200 may determine whether to the packages are optimized. In some instances, method 200 may determine whether the standardized set of memory instances refer to optimize packages. If yes, then method 200 may proceed to block 232, and if no, then method 200 may proceed to block 222.

At block 222, method 200 may identify factors that may be used to optimize the memory instance sets. Also, at block 226, method 200 may generate reduced packages with the identified factors, and the reduced packages may be referred to as optimized packages that include a reduced set of memory instances. In some instances, method 200 may use the memory compiler as a package manager so as to derive a reduced set of memory instances based on the standardized set of memory instances. Also, in some instances, derived data and information associated with the reduced memory instances may be packaged in one or more derived package files. Moreover, a generated package may include arcs, memory instances and/or derating configurations, and each arc may be assigned with several instances needed for memory compiler characterization. There may be several packages in the memory compiler that are categorized based on factors or features, such as, e.g., timing, power, leakage and/or accuracy-settings.

At block 232, method 200 may perform characterization. In some instances, method 200 may characterize the standardized set of memory instances for the compiler space with one or more different features and/or aspect ratios, and also, method 200 may validate the standardized set of memory instances for the compiler space. In addition, in some instances, method 200 may characterize the reduced set of memory instances for the compiler space with one or more different features and/or aspect ratios, and method 200 may validate the reduced set of memory instances for the compiler space.

At decision block 236, method 200 may determine whether to check accuracy of the characterized instances in the reduced set of memory instances. If no, then at block 240, method 200 may generate a memory compiler database with design patterns, and then method 200 returns to block 222. If yes, when accuracy is within a tolerance (awt), then at block 244, method 244 may perform padding of the characterized instances in the reduced set of memory instances.

At block 248, method 200 may generate a memory compiler database. In some instances, method 220 may use the memory compiler to build (or generate) the memory compiler database for a compiler space that is based on the standardized set of memory instances and the reduced set of memory instances. In some instances, method 200 may also build a derived corner database having the reduced set of memory instances based on characterizing the standardized set of memory instances. Also, in some instances, the reduced set of memory instances may be selected to generate data and information for other compiler options, and a destination corner database having destination corners may be derived from the source corners of the memory compiler configuration, e.g., using an intelligent scaling technique and/or an intelligent interpolation technique.

At block 252, method 200 may operate the memory compiler, and at block 256, method 200 may use the memory compiler to generate a liberty model based on the data and information stored in the memory compiler database. In some instances, method 200 may use the memory compiler to operate (or interface with) a liberty generator that may be used to generate one or more liberty models based on the data and information stored in the memory compiler database.

Various schemes and techniques described herein may provide for an efficient technique to select an optimized set of instances to use for characterization of the different arcs for a given memory-compiler option. In various implementations, a system decided may refer a system capable of characterizing one or more base option sets (standardized option sets), and all other option sets are characterized for corner instances for a memory-compiler bin in the compiler space. The system may decide whether to characterize one or more instances from machine learning with either physical and/or data for determining whether a sub-region, or single-instance, or row, or column, or row and column instances for each arc. Also, in some instances, a memory compiler bin may represent a particular region and/or space in the memory compiler space. Once arcs have been characterized for a given option, then the characterized options may be reused to derive other options, which is described in greater detail herein in reference to FIGS. 3A-3C.

FIGS. 3A-3C illustrate diagrams of various variations and/or scaling between options in accordance with implementations described herein. In particular, characterized options may include various different options in a memory compiler configuration. In some instances, different options may include a standard-base option set, a column-redundancy option set, a large-range level-shifter option set, and/or a power-gating option set.

As shown in FIG. 3A, an option set may refer to a one-dimensional (1D) option set that provides for characterizing arcs for a standard-option using the instance-selection options as needed. For instance, in reference to a column-redundancy option, a selected set of arcs may have different values compared to that of a standard option, such as, e.g., data setup/hold, write enable (wen) setup/hold, and/or access-time. Some other arcs may remain at the same value between the standard options and redundancy options, and the data mentioned herein below is in pico-seconds (pS).

FIG. 3A shows a 1D variation or delta between option 302A, wherein data-hold time values for a standard-option are shown in table 310. Also shown are data-hold time values for a redundancy-option in table 312. Also shown is a capture of the difference or delta between the two-options 310, 312 for minimum rows with three-column variants in table 314. Therefore, in some instances, the remaining values may be derived for this arc using the delta-table 314 and the table from the standard-option 310. In reference to time-delay setup (tds), the following statement may be applied:

$$tds(\text{redundancy-option}) = tds(\text{standard-option}) + \text{delta (red-}std\text{)} \quad (1):$$

In some instances, the same approach may be used if an option has arcs that vary for columns only irrespective of rows, i.e., 1D variation options.

As shown in FIG. 3B, an option set may refer to a two-dimensional (2D) option set that provides for characterizing arcs for a standard-option using the instance-selection options as needed. For instance, in reference to a power-gating option, a selected set of arcs may have different values when compared to that of a standard option, e.g., by a small percentage. Other arcs may remain at the same value between the standard and redundancy options, and the data mentioned herein below is in pico-seconds (pS).

In some instances, FIG. 3B shows a 2D variation or scaling between option 302B, wherein access-time time values for a standard-option are shown in table 320. Also shown are access-time time values for a power-gating-option in table 322. Also shown is a capture ratio between two-options 320, 322 for the four corner instance combinations in table 324. Therefore, in some instances, the remaining values may be derived for this arc for the power-gating option using the ratio-table 324 and the table 320 from the standard-option. In reference to time-access (tacc), the following statement may be applied:

$$tacc(\text{powergating-option}) = tacc(\text{standard-option}) * \text{ratio (}pg/std\text{)} \quad (2):$$

In some instances, observed design patterns may appear in characterized data by a decision-system in some standard-base option sets. The decision-system may also be optimized by choosing whether an arc uses row-or-column instances and/or row-and-column instances from prior design knowledge. Sometimes, a configure intra-option may be used for further optimization or to allow the system to detect optimization, which may include row-variants with minimum-bits for address-setup arc, minimum for address-hold arc, and/or column-variants with minimum-rows for data/wen setup/hold arc. Also, the decision-system may be fully optimized for runtime to work on simulations with arcs so as to quickly analyze several sets of data to group the arcs based on sub-region or row, or column, or row and column instances. The decision-system may make the arc instance sets ready for final characterization for process and domain specific PVT corners.

As shown in FIG. 3C, an option set may refer to an optimized base option set 302C that provides for liberty arcs that vary only with rows as shown in table 330. In some instances, scenarios where data varies only across rows but stays the same irrespective of columns is shown in table 330, and data in table 330 is in pico-seconds (pS). In some solutions, only 3-instances (row-variants) may be selected with minimum-columns (fixed), and any instance in between 8 and 128 rows may receive the curve fitted value. Some examples include address-setup, CEN-setup, address-power, and/or CEN-power.

As shown in FIG. 3C, an option set may refer to an optimized base option set 302C that provides for liberty arcs that vary only with columns as shown in table 332. In some instances, scenarios where the data varies only across columns but stays the same irrespective of rows is shown in table 334, and also, data in table 332 is in pico-seconds (pS). In some solutions, only 3-instances (column-variants) are selected with minimum-rows (fixed), and any instance in between 4 and 64 columns may receive a curve fitted value. Some examples may include data-setup/hold and wen setup/hold.

As shown in FIG. 3C, an option set may refer to an optimized base option set 302C that provides for liberty arcs that vary with both rows and columns in table 334. In some instances, scenarios where data varies across both rows and columns is shown in table 334, and also, data in table 334 is in pico-seconds (pS). In some solutions, only 9-instances (row and column-variants) may be selected, and any instance in between 4 and 64 columns and 4 and 128 rows may receive a curve fitted value. Some examples may include access-time and cycle-time.

As shown in FIG. 3C, an option set may refer to an optimized base option set 302C that provides for liberty arcs that do not vary with rows or columns in table 336. In some instances, scenarios where the data does not vary across columns and rows is shown in table 336, and data in table 336 is in pico-seconds (pS). In some solutions, only 1-instance with minimum-columns and minimum-rows (fixed) may be selected, and one or more or all instances may receive the same value from this instance. Some examples may include address-hold, cen-hold, and gwen-power.

In various implementations, with the above types of instance selections, one or more or all arcs for a given option may be covered. Also, observed design patterns in the characterized data may be provided in base option sets by the decision-system. Different bins may be identified in each base option set and then marked as region sets, and each region set may be tagged with a multiplexer (mux), flexible_banking, flexible_slicing, slice-1/slice-2 option values. Also, each region set may have one or more or several instances of characterized data to cover any non-linearity of the data. In some instances, memory compiler characterization systems may involve characterizing several hundred instances with semi-automatic generated vectors, curve fitting, and gathering curve-fitted data along with equating for final results. Also, in other instances, memory compiler characterization systems may involve verifying equations against characterized data with data validation and data accuracy flows along with performing checks to ensure frontend EDA (electronic design automation) have viewable results that are aligned with characterized results.

Memory compilers may be enabled to support several hundred PVT corners, and it is inefficient, time-consuming and costly to characterize same sets of instances for all PVT corners. Thus, various schemes and techniques described herein may be used to build a system to thereby generate reduced packages, use simulation data of reduced packages, and reuse base curves of a pre-existing corner database. These features may be achieved with a scaling algorithm to produce accurate data, and a new scale factor interpolation method may be used to improve accuracy, produce accurate results, and enable reduced characterization time along with improved accuracy. With this approach, a memory compiler corner database may be generated with reduced simulation time so as to save cost and shortens the time-to-market. In some instances, a system generated with reduced packages may refer to a system that is capable of producing corner (row/col) instances, or individual corner region (row/col) instances, or row instances, or column instances, or a single-instance for a memory-compiler bin in a memory compiler space. The system may also be capable of deciding to characterize less instances from machine learning with either physical/data for deciding whether sub-regions, or a single-instance, or row, or column, or row and column instances for each arc are needed.

Figure 4:
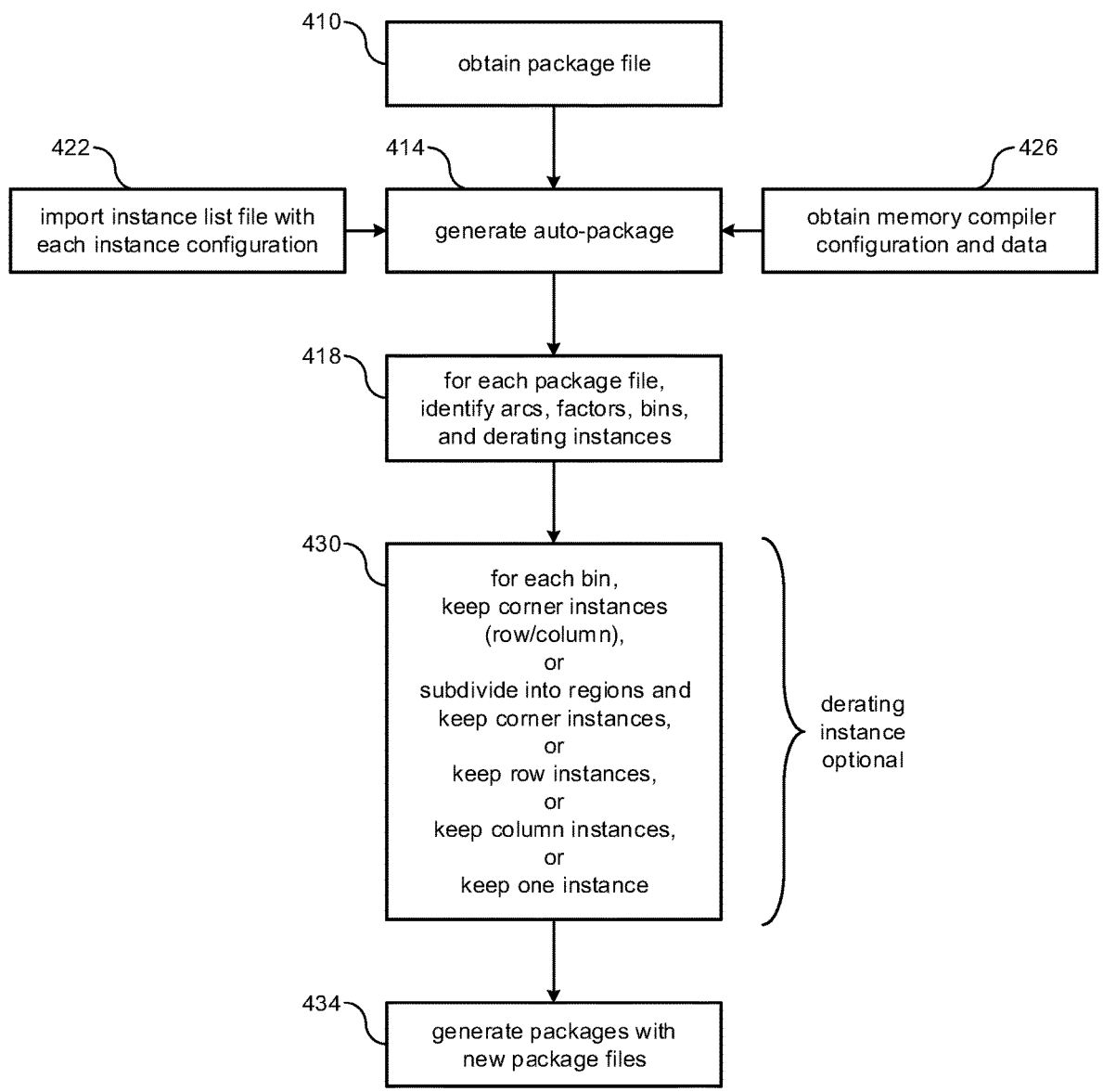
FIG. 4 illustrates a process flow diagram of a method for providing memory compiler techniques in accordance with implementations described herein.

FIG. 4 illustrates a process diagram of a method 400 for providing memory compiler techniques in accordance with implementations described herein.

It should be understood that even though method 400 may indicate a particular order of operation execution, in some cases, various portions of the operations may be executed in a different order, and on different systems. In other cases, other operations and/or steps may be added to and/or omitted from method 400. Also, method 400 may be implemented in hardware and/or software. If implemented in hardware, method 400 may be implemented with components and/or circuitry, as described herein in reference to FIGS. 1-3C. Also, if implemented in software, method 400 may be implemented as a program and/or software instruction process for providing memory compiler schemes and techniques described herein. Also, if implemented in software, the instructions related to implementing method 400 may be recorded in memory and/or a database. For instance, various types of computing devices having at least one processor and memory may be configured to perform method 400.

In various implementations, method 400 may refer to a method of designing, providing, building, fabricating and/or manufacturing memory compiler architecture as an integrated system, device and/or circuitry that may involve use of the various system or circuit components described herein so as to implement memory compiler schemes and techniques associated therewith. In some instances, the memory compiler architecture may be integrated with computing circuitry and various related components on a single chip, and the memory compiler architecture may be implemented in various embedded chip-level systems for various electronic, mobile and Internet-of-things (IoT) applications, including remote sensor node applications.

At block 410, method 400 may obtain one or more package files. Also, in some instances, method 400 may use a memory compiler that is used for building a memory compiler database. In some instances, the memory compiler may be configured to access a source corner database having memory instances.

At block 414, method 400 may generate one or more auto-packages files, e.g., with input from obtained package files from block 410, with input from an import instance, list file with each instance configuration at block 422, and/or with input from obtaining a memory compiler configuration and data related thereto. In some instances, method 400 may generate corner package files for the memory instances. In some instances, method 400 may build a memory compiler database for a compiler space based on the corner package files and/or the reduced package files.

At block 418, for each package file, method 400 may identify arcs, factors, bins, and derating instances. In some instances, the corner package files may include timing arcs, memory instances and/or derating configurations, and each timing arc of the timing arcs may be assigned multiple memory instances that may be used for memory compiler characterization. In some implementations, method 400 may use a memory compiler that is configured to categorize the memory instances based on one or more of timing, power, leakage, and accuracy-settings.

At block 430, for each bin, method 400 may keep corner instances (row/column instances), or subdivide each bin into regions and keep corner instances, or keep row instances, or keep column instances, or keep one instance. In various instances, at block 430, method 200 may implement these various operations as an option, and thus, block 430 may be considered as a derating instance that is optional.

At block 434, method 400 may generate packages with new package files. In some instances, method 400 may generate reduced package files based on simulating corner package files and based on reusing pre-existing entries of the memory instances provided in the source corner database. In some instances, method 400 may interpolate data associated with the corner package files and/or the reduced package files to thereby provide characterized data for the memory instances that is used for memory compiler characterization. In some instances, scale-factor interpolation may be used to interpolate the data associated with the corner package files and the reduced package files. In some instances, the reduced package files may be selected to generate data and information for other compiler options, and a destination corner database having destination corners may be derived from the source corners of the source corner database using an intelligent scaling technique and/or an intelligent interpolation technique.

In some implementations, scaling of data may be used for memory compilers to reduce characterization costs while maintaining accuracy. Ratio/Delta scaling may be applied to one or more existing source corner databases to produce new corners by using reference simulations. Also, in some instances, a new scale factor interpolation method may be configured to be predictive, to improve accuracy, and to produce accurate results, which enables reduced characterization time with improved accuracy. Therefore, with the various compiler schemes and techniques described herein, a number of simulations may be reduced instead of running simulations for all instance and option combinations without losing accuracy to generate source corners and destination corners.

Figure 5:
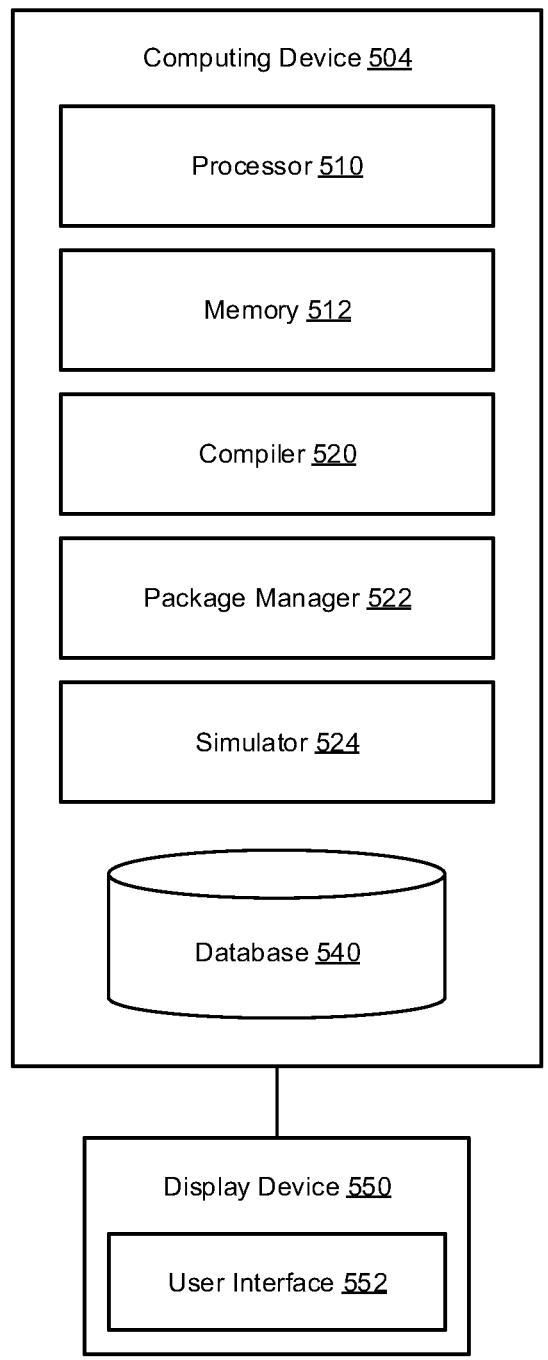
FIG. 5 illustrates a schematic diagram of a computing system for providing memory compiler techniques in accordance with implementations described herein.

FIG. 5 illustrates a diagram of a system 500 for providing memory compiler database techniques in accordance with implementations described herein.

In reference to FIG. 5, the system 500 may be associated with at least one computing device 504 that is implemented as a special purpose machine configured for implementing memory compiler database schemes and techniques in physical design, as described herein. In some instances, the computing device 504 may include any standard element(s) and/or component(s), including at least one processor(s) 510, memory 512 (e.g., non-transitory computer-readable storage medium), one or more database(s) 540, power, peripherals, and various other computing elements and/or components that may not be specifically shown in FIG. 5. The computing device 504 may include instructions stored on the non-transitory computer-readable medium 512 that are executable by the at least one processor 510. The computing device 504 may be associated with a display device 550 (e.g., a monitor or other display) that may be used to provide a user interface (UI) 552, such as, e.g., a graphical user interface (GUI). In some instances, the UI 552 may be used to receive various parameters and/or preferences from a user for managing, operating, and/or controlling the computing device 504. Thus, the computing device 504 may include the display device 550 for providing various output to a user, and the display device 550 may include the UI 552 for receiving input from the user.

In some implementations, as shown in FIG. 5, the computing device 504 may also include a compiler 520 (or memory compiler, or software program) that is configured to translate computer code (or source code) written in a source programming language into a target language, such as, e.g., an instruction sequence, that causes a processor to perform various operations. I.e., the compiler 520 may refer to a software program that provides a compiler space and also translates source code from a high-level programming language to a lower level language, such as, e.g., assembly language, object code, and/or machine code, to thereby create or generate various executable programs that may cause a processor to perform various operations with various instruction sequences.

In some implementations, as shown in FIG. 5, the computing device 504 may include a package manager 522 that is configured to cause the at least one processor 510 to implement one or more or all memory compiler database schemes and techniques described herein in reference to FIGS. 1-4, including implementing integrated circuitry in physical design. The package manager 522 may be implemented in hardware and/or software. For instance, if implemented in software, the package manager 522 may be stored in memory 512 and/or database 540. Also, in some instances, if implemented in hardware, the package manager 522 may refer to a separate processing component that is configured to interface with the processor 510.

In some instances, the package manager 522 may be configured to cause the at least one processor 510 to perform various operations, as provided herein in reference to memory compiler schemes and techniques described in FIGS. 1-4. The memory 512 has stored thereon instructions that, when executed by the processor 510, cause the processor 510 to perform one or more or all of the following operations.

For instance, the package manager 522 may be configured to cause the at least one processor 510 to perform a method operation to select source corners from a memory compiler configuration. In some instances, the package manager 522 may be configured to access the memory instances stored in the memory compiler configuration.

In some instances, the package manager 522 may be configured to cause the at least one processor 510 to perform a method operation to generate a standardized package of memory instances for the selected source corners. The standardized package may include timing arcs, memory instances and/or derating configurations, and also, each timing arc of the timing arcs may be assigned multiple memory instances that are used for memory compiler characterization. Also, the memory compiler may also be configured to categorize the memory instances based on one or more of timing, power, leakage, and accuracy-settings associated with the standardized package.

In some instances, the package manager 522 may be configured to cause the at least one processor 510 to perform a method operation to derive a reduced package of the memory instances based on the standardized package of memory instances. The package manager 522 may be configured to generate the reduced package based on simulating the standardized package and/or based on reusing pre-existing entries of the memory instances provided in the memory compiler configuration. The memory compiler may be configured to categorize the memory instances based on one or more of timing, power, leakage, and accuracy-settings associated with the reduced package.

In some instances, the package manager 522 may be configured to cause the at least one processor 510 to perform a method operation to scale data related to the standardized package and the reduced package so as to provide characterized data used for manufacturing the memory instances. The package manager 522 may be configured to build a memory compiler database for a compiler space based on the standardized package and/or the reduced package of the memory instances. The package manager 522 may be configured to interpolate data associated with the standardized package and the reduced package to thereby provide characterized data for the memory instances that is used for memory compiler characterization.

In some instances, the package manager 522 may be configured to cause the at least one processor 510 to perform a method operation to characterize the standardized package of memory instances for the compiler space with one or more different features and/or aspect ratios. Also, the package manager 522 may be configured to validate the standardized package of memory instances for the compiler space.

In some instances, the package manager 522 may be configured to cause the at least one processor 510 to perform a method operation to characterize the reduced package of memory instances for the compiler space with one or more different features and/or aspect ratios. Also, the package manager 522 may be configured to validate the reduced package of memory instances for the compiler space.

In some instances, the package manager 522 may be configured to cause the at least one processor 510 to perform a method operation to build a derived corner database having the reduced package of memory instances based on characterizing the standardized package of memory instances. The reduced package of memory instances may be selected to generate information for other compiler options. The derived corner database may include destination corners that are derived from the source corners of the memory compiler configuration using an intelligent scaling technique.

In accordance with various implementations described herein in reference to FIGS. 1-4 any one or more or all of these operations performed by the package manager 522 may be altered, modified, revised and/or changed to thereby provide various specific embodiments as shown in FIGS. 1-4. Also, each of the operations may be in the form of a logic block or module having memory compiler definitions, and the logic block or module may refer to a physical layout structure associated with integrated circuitry that is included in a place and route environment for EDA.

In some implementations, as shown in FIG. 5, the computing device 504 may also include a simulator 522 that is configured to cause the at least one processor 510 to generate one or more simulations of various integrated circuitry. The simulator 522 may be referred to as a simulating component or module and may be implemented in hardware or software. If implemented in software, the simulator 522 may be recorded or stored in memory 512 or the database 540. If implemented in hardware, the simulator 520 may be a separate processing component configured to interface with the processor 510. In some instances, the simulator 522 may refer to a SPICE simulator that is configured to generate SPICE simulations of integrated circuitry. SPICE is an acronym for Simulation Program with Integrated Circuit Emphasis, which refers to an open source analog electronic circuit simulator. Also, SPICE may refer to general-purpose software used by the semiconductor industry to check the integrity of integrated circuit designs and to predict the behavior of integrated circuit designs. Thus, in some instances, the package manager 522 may be configured to interface with the simulator 522 so as to generate timing data based on one or more simulations (including, e.g., SPICE simulations) of an integrated circuit that may be used for analyzing performance characteristics of the integrated circuit including timing data of the integrated circuit. Moreover, the package manager 522 may be configured to use various generated simulations (including, e.g., SPICE simulations) of the integrated circuitry for evaluating operational behavior and conditions thereof.

In some implementations, the computing device 504 may include one or more databases 540 configured to store and/or record various data and information related to implementing memory compiler schemes and techniques in physical design. Also, in some instances, one or more database(s) 540 may be configured to store and/or record various information related to integrated circuitry, operating conditions, operating behavior and/or timing related data. Also, the database(s) 540 may be configured to store and/or record data and information related to integrated circuitry along with various timing data with respect to simulation data (including, e.g., SPICE simulation data).

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a system. The system may include a processor and memory having instructions stored thereon that, when executed by the processor, cause the processor to select source corners from a memory compiler configuration and generate a standardized package of memory instances for the selected source corners. The instructions may cause the processor to derive a reduced package of the memory instances based on the standardized package of memory instances and scale data related to the standardized package and the reduced package so as to provide characterized data used for manufacturing the memory instances.

Described herein are various implementations of a method. The method may include selecting source corners from a memory compiler configuration and generating a standardized set of memory instances for the selected source corners. The method may include deriving a reduced set of memory instances based on the standardized set of memory instances and building a memory compiler database for a compiler space based on the standardized set of memory instances and the reduced set of memory instances.

Described herein are various implementations of a method. The method may include accessing a source corner database having memory instances and generating corner package files for the memory instances. The method may include generating reduced package files based on simulating the corner package files and based on reusing pre-existing entries of the memory instances provided in the source corner database. The method may include interpolating data associated with the corner package files and the reduced package files to thereby provide characterized data for the memory instances that is used for memory compiler characterization.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A system comprising:
a processor; and
memory having instructions stored thereon that, when executed by the processor, cause the processor to:
select source corners from a memory compiler configuration;
generate a standardized package of memory instances for the selected source corners;
derive a reduced package of the memory instances based on the standardized package of memory instances;
characterizing the reduced package of memory instances for a compiler space with one or more different features and aspect ratios;
validating the reduced package of memory instances for the compiler space; and
scale data related to the standardized package and the reduced package so as to provide characterized data used for manufacturing the memory instances.

2. The system of claim 1, wherein the instructions cause the processor to:
access the memory instances stored in the memory compiler configuration; and
build a memory compiler database for a compiler space based on the standardized package of the memory instances and the reduced package of the memory instances.

3. The system of claim 1, wherein the instructions cause the processor to:
generate the reduced package based on simulating the standardized package and based on reusing pre-existing entries of the memory instances provided in the memory compiler configuration; and
interpolating data associated with the standardized package and the reduced package to thereby provide characterized data for the memory instances that is used for memory compiler characterization.

4. The system of claim 1, further comprising:
building a derived corner database having the reduced package of memory instances based on characterizing the standardized package of memory instances,
wherein the reduced package of memory instances is selected to generate information for other compiler options, and
wherein the derived corner database has destination corners that are derived from the source corners of the memory compiler configuration using an intelligent scaling technique.

5. The system of claim 1, wherein the standardized package has timing arcs, memory instances and derating configurations, wherein each timing arc of the timing arcs is assigned multiple memory instances that are used for memory compiler characterization.

6. The system of claim 1, further comprising:
a memory compiler configured to categorize the memory instances based on one or more of timing, power, leakage, and accuracy-settings.

7. A system comprising:
a processor; and
memory having instructions stored thereon that, when executed by the processor, cause the processor to:
select source corners from a memory compiler configuration;
generate a standardized package of memory instances for the selected source corners;
characterizing the standardized package of memory instances for a compiler space with one or more different features and aspect ratios;
validating the standardized package of memory instances for the compiler space;
derive a reduced package of the memory instances based on the standardized package of memory instances; and scale data related to the standardized package and the reduced package so as to provide characterized data used for manufacturing the memory instances.

8. A method comprising:
selecting source corners from a memory compiler configuration;
generating a standardized set of memory instances for the selected source corners;
deriving a reduced set of memory instances based on the standardized set of memory instances;
characterizing the reduced set of memory instances for the compiler space with one or more different features and aspect ratios;
validating the reduced set of memory instances for the compiler space; and
building a memory compiler database for a compiler space based on the standardized set of memory instances and the reduced set of memory instances.

9. The method of claim 8, wherein information associated with the standardized memory instances is packaged in a corner package file, and wherein information associated with the reduced memory instances is packaged in a derived package file.

10. The method of claim 8, further comprising:
building a derived corner database having the reduced set of memory instances based on characterizing the standardized set of memory instances.

11. The method of claim 8, wherein the reduced set of memory instances is selected to generate information for other compiler options, and wherein a destination corner database having destination corners is derived from the source corners of the memory compiler configuration using an intelligent scaling technique.

12. A method comprising:
selecting source corners from a memory compiler configuration;
generating a standardized set of memory instances for the selected source corners;
deriving a reduced set of memory instances based on the standardized set of memory instances;
characterizing the standardized set of memory instances for the compiler space with one or more different features and aspect ratios;
validating the standardized set of memory instances for the compiler space; and
building a memory compiler database for the compiler space based on the standardized set of memory instances and the reduced set of memory instances.

13. A method comprising:
accessing a source corner database having memory instances;
generating corner package files for the memory instances;
generating reduced package files having a reduced set of the memory instances based on simulating the corner package files for the memory instances and based on reusing pre-existing entries for a standardized set of the memory instances provided in the source corner database;
building a derived corner database with derived package files having the reduced set of memory instances based on characterizing the standardized set of memory instances; and
interpolating data associated with the corner package files, the derived package files and the reduced package files so as to thereby provide characterized data for the memory instances that is used for memory compiler characterization.

14. The method of claim 13, wherein scale-factor interpolation is used to interpolate the data associated with the corner package files and the reduced package files.

15. The method of claim 13, further comprising:
building a memory compiler database for a compiler space based on the corner package files and the reduced package files.

16. The method of claim 13, wherein the corner package files include timing arcs, memory instances and derating configurations, wherein each timing arc of the timing arcs is assigned multiple memory instances that are used for memory compiler characterization.

17. The method of claim 13, further comprising:
providing a memory compiler to categorize the memory instances based on one or more of timing, power, leakage, and accuracy-settings.

18. The method of claim 13, wherein the reduced package files are selected to generate information for other compiler options, and wherein a destination corner database having destination corners is derived from the source corners of the source corner database using an intelligent scaling technique.

* * * * *